(12) United States Patent
Sogai (10) Patent No.: US 10,707,383 B2
(45) Date of Patent: Jul. 7, 2020

(54) LIGHT EMITTING DEVICE AND METHOD OF MANUFACTURING LIGHT EMITTING DEVICE

(71) Applicant: NICHIA CORPORATION, Anan-shi, Tokushima (JP)

(72) Inventor: Takanobu Sogai, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 95 days.

(21) Appl. No.: 15/960,051

(22) Filed: Apr. 23, 2018

(65) Prior Publication Data

US 2018/0315895 A1   Nov. 1, 2018

(30) Foreign Application Priority Data

Apr. 28, 2017   (JP) .................. 2017-089785

(51) Int. Cl.
*H01L 33/48* (2010.01)
*H01L 33/00* (2010.01)
*H01L 33/26* (2010.01)
*H01L 33/36* (2010.01)
*H01L 33/56* (2010.01)
*H01L 33/58* (2010.01)
(Continued)

(52) U.S. Cl.
CPC .......... *H01L 33/483* (2013.01); *H01L 33/005* (2013.01); *H01L 33/26* (2013.01); *H01L 33/36* (2013.01); *H01L 33/56* (2013.01); *H01L 33/58* (2013.01); *H01L 51/56* (2013.01); *H01L 33/54* (2013.01); *H01L 2933/005* (2013.01); *H01L 2933/0058* (2013.01)

(58) Field of Classification Search
CPC .............................. H01L 33/483; H01L 51/56
See application file for complete search history.

(56) References Cited

U.S. PATENT DOCUMENTS

2011/0309388 A1   12/2011   Ito et al.
2012/0140506 A1   6/2012   Waragawa et al.
(Continued)

FOREIGN PATENT DOCUMENTS

JP   2012-004303 A   1/2012
JP   2014-232866 A   12/2014
(Continued)

*Primary Examiner* — Lex H Malsawma
*Assistant Examiner* — Xia L Cross
(74) *Attorney, Agent, or Firm* — Global IP Counselors, LLP (57) ABSTRACT

A light emitting device includes: a light emitting element; a light-transmissive member including a first lower surface, an outer periphery of which being located on an outer side of the light extraction surface in a plan view, an upper surface having a greater area than an area of the first lower surface, a first lateral surface connected to the upper surface, a second lateral surface positioned on an inner side of the first lateral surface and connected to the first lower surface, and a second lower surface connected to the first and second lateral surfaces; a light guiding member covering at least a portion of a lateral surface of the light emitting element and at least a portion of the second lateral surface and the second lower surface; and a covering member covering the first lateral surface and a lateral surface of the light guiding member.

10 Claims, 5 Drawing Sheets

(51) Int. Cl.
    *H01L 51/56*     (2006.01)
    *H01L 33/54*     (2010.01)

(56) References Cited

U.S. PATENT DOCUMENTS

| | | |
|---|---|---|
| 2012/0236582 A1 | 9/2012 | Waragawa et al. |
| 2013/0026527 A1 | 1/2013 | Ichikawa |
| 2013/0033169 A1* | 2/2013 | Ito .................. H01L 33/505 |
| | | 313/502 |
| 2014/0322844 A1 | 10/2014 | Ichikawa et al. |
| 2015/0048398 A1 | 2/2015 | Ichikawa et al. |
| 2015/0076548 A1 | 3/2015 | Ichikawa |
| 2015/0102366 A1 | 4/2015 | Wada |
| 2015/0118771 A1 | 4/2015 | Ichikawa |
| 2015/0263254 A1 | 9/2015 | Miyoshi et al. |
| 2016/0093777 A1* | 3/2016 | Sato .................. H01L 25/167 |
| | | 257/98 |
| 2016/0380165 A1 | 12/2016 | Miyoshi et al. |
| 2017/0025572 A1* | 1/2017 | Shichijo ............. H01L 33/20 |
| 2017/0062671 A1* | 3/2017 | Hashimoto ......... H01L 33/54 |
| 2017/0062681 A1 | 3/2017 | Miyoshi et al. |
| 2017/0125649 A1 | 5/2017 | Sato et al. |
| 2017/0301839 A1 | 10/2017 | Miyoshi et al. |

FOREIGN PATENT DOCUMENTS

| | | |
|---|---|---|
| JP | 2015-012143 A | 1/2015 |
| JP | 2015-029079 A | 2/2015 |
| JP | 2015-079805 A | 4/2015 |
| JP | 2015-188069 A | 10/2015 |
| JP | 2016-072515 A | 5/2016 |
| JP | 2017-050359 A | 3/2017 |
| WO | 2011126000 A1 | 10/2011 |

\* cited by examiner

LIGHT EMITTING DEVICE AND METHOD OF MANUFACTURING LIGHT EMITTING DEVICE

CROSS-REFERENCE TO RELATED APPLICATION

This application claims priority to Japanese Patent Application No. 2017-089785 filed on Apr. 28, 2017, the disclosure of which is hereby incorporated by reference in its entirety.

BACKGROUND

1. Technical Field

The present disclosure relates to a light emitting device and a method of manufacturing the light emitting device.

2. Description of Related Art

There has been proposed a light emitting device including a light emitting element and a plate-like optical layer mounted on the upper surface of the light emitting element via a transparent material layer (for example, see JP 2012-4303 A).

In the light, emitting device such as described in JP 2012-4303 A, light emitting area is reduced, and the light extraction efficiency is improved.

SUMMARY

With the plate-like optical layer having a lower surface greater than the upper surface of the light emitting element light distribution is uneven between the light extraction surface of the light emitting element and the outer peripheral portion of the light emitting element. Thus, this structure tends to cause light emission unevenness.

An object of the present disclosure is to provide a light emitting device in which color unevenness at its light emitting surface can be reduced and a method of manufacturing the light emitting device.

A light emitting device according to one embodiment of the present disclosure includes: a light emitting element including a light extraction surface and a lateral surface; a light-transmissive member including a first lower surface in contact with the light extraction surface of the light emitting element, an outer periphery of the first lower surface being located on an outer side of the light extraction surface of the light emitting element in a plan view, an upper surface opposite to the first lower surface and having a greater area than an area of the first lower surface, a first lateral surface connected to the upper surface, a second lateral surface positioned on an inner side of the first lateral surface in the plan view and connected to the first lower surface, and a second lower surface connected to the first lateral surface and the second lateral surface; a light guiding member covering at least a portion of the lateral surface of the light emitting element and at least a portion of the second lateral surface and at least a portion of the second lower surface of the light-transmissive member; and a covering member covering the first lateral surface of the light-transmissive member and a lateral surface of the light guiding member.

A method of manufacturing a light emitting device according to one embodiment of the present disclosure includes: bonding a plurality of light emitting elements each having an outer peripheral lateral surface onto a light-transmissive substrate; forming at least one groove on the light-transmissive substrate to surround an outer periphery of each of the plurality of light emitting elements; disposing at least one light guiding member in the groove to continuously cover the groove and the outer peripheral lateral surfaces of adjacent ones of the plurality of light emitting elements; and singulating the light-transmissive substrate at a position between adjacent ones of the plurality of light emitting elements, to obtain a plurality of light emitting devices in each of which at least one of the light emitting elements is bonded to a single light-transmissive member.

Certain embodiments of the present disclosure provides a light emitting device in which color unevenness at it light emitting surface can be reduced, and a method of manufacturing the light emitting device.

DETAILED DESCRIPTION OF EMBODIMENTS

With reference to the drawings, a description will be given below of a light emitting device according to an embodiment of the present disclosure and a method of manufacturing the tight emitting device. The drawings referred to in the description below are intended to schematically show certain embodiments of the present invention, the scale, interval, positional relationship and the like of the members may be exaggerated, or the members may be partially omitted. Further, in the following description, basically the same or similar members are denoted by the same name or reference numeral, and a detailed description thereof may not be repeated as appropriate.

Light Emitting Device

Figure 1A:
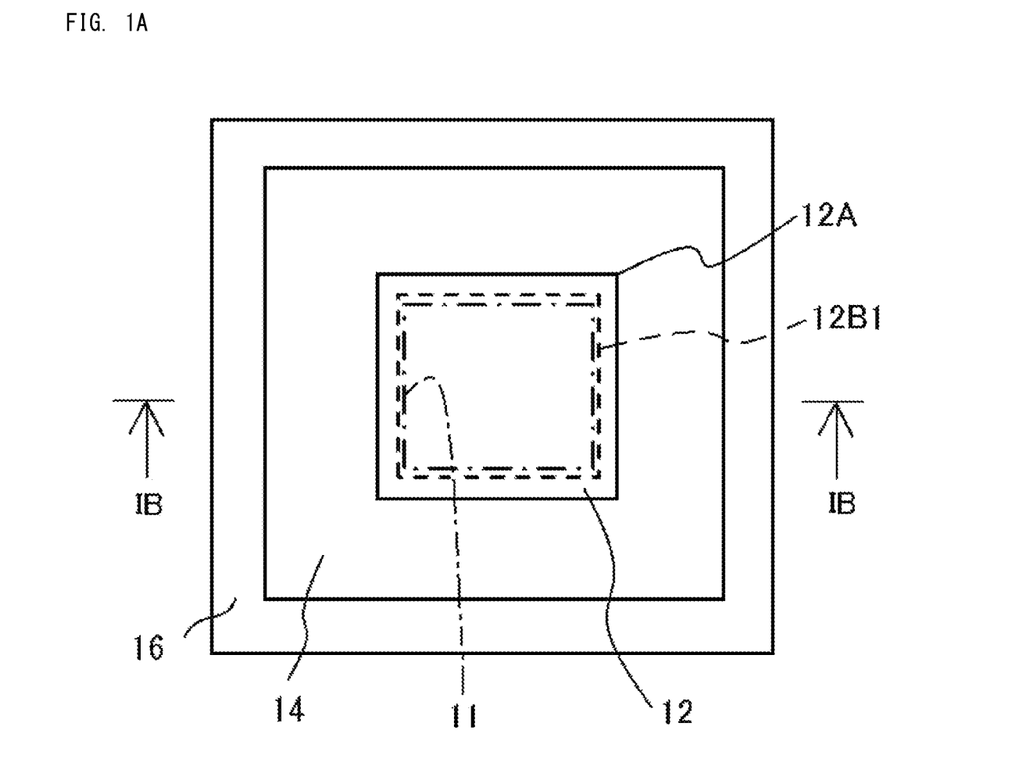
FIG. 1A is a schematic plan view schematically showing the structure of a light emitting device according to an embodiment of the present disclosure.
Figure 1B:
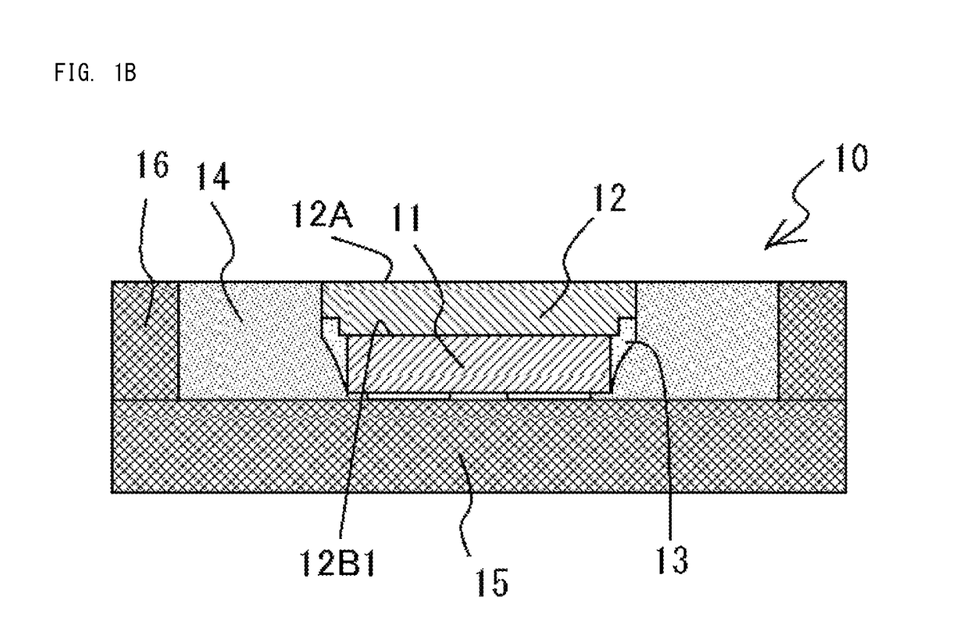
FIG. 1B is a cross-sectional view taken along a line IB-IB in FIG. 1A.
Figure 1C:
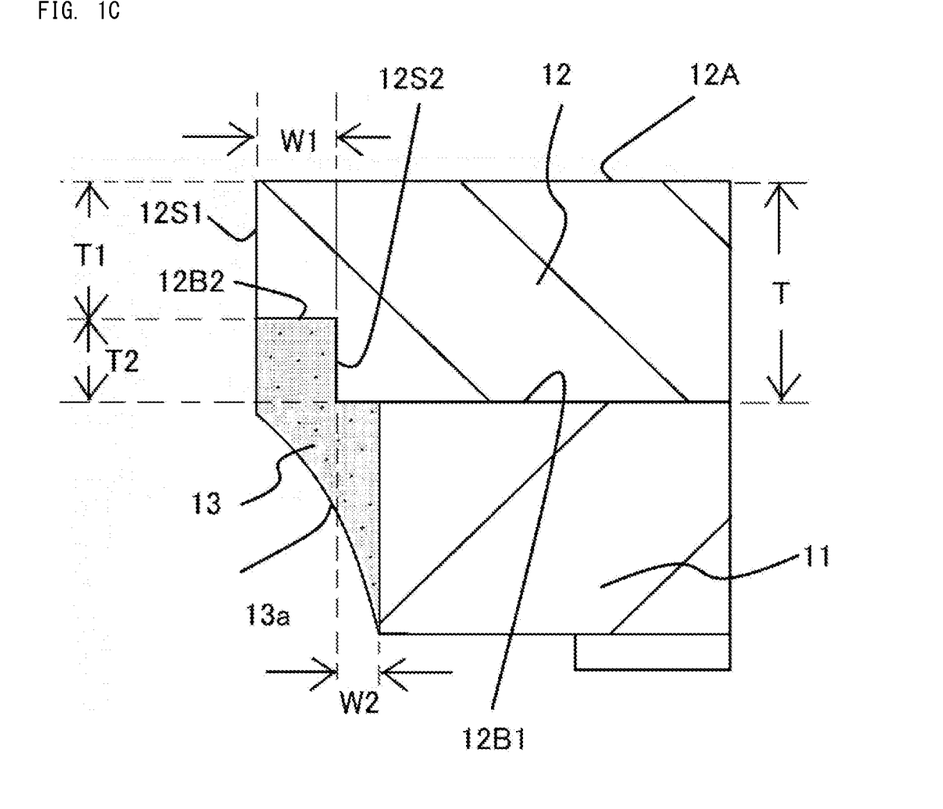
FIG. 1C is an enlarged view of a part of FIG. 1B.

As shown in FIGS. 1A to 1C, the light emitting device according to the present embodiment includes a light emitting element 11, a light-transmissive member 12 disposed above the light emitting element 11, a light guiding member 13 covering the lateral surfaces of the light emitting element 11 and a lower surface of the light-transmissive member 12, and a covering member 14 covering the lateral surfaces of each of the light guiding member 13 and the light-transmissive member 12. Such a light emitting device 10 can be used for, for example, a light source for general illumination, a light source for a vehicle, or the like.

In the light emitting device 10, as will be described below, a lower surface of the tight-transmissive member 12, which is a surface, of the light-transmissive member 12 at a light emitting element side, includes a projecting portion in contact with a light extraction surface of the light emitting element. In other words, the light-transmissive member 12 has two lower surfaces having heights from the upper surface different from each other. Thus, the light-transmissive member 12 in which a thickness thereof at the outer peripheral part of the light extraction surface of the light emitting element 11 (that is, a thickness thereof on an outer side of the light emitting element 11 in a plan view) is smaller than a thickness of the central part (that is, a region overlapping the light emitting element 11 in a plan view) can be disposed. With the light-transmissive member 12 having such a structure, unevenness in light emission can be effectively reduced at the light emitting surface of the light emitting device 10 in which the upper surface of the light-transmissive member 12 is the light emitting surface.

With the light-transmissive member 12 disposed so as to be in contact with the light emitting element 11, light emitted from the light emitting element 11 is incident on the projecting portion of the light-transmissive member 12 (that is, a region overlaid on the light emitting element 11 in a plan view), without passing through another member (for example, an adhesive agent or the like) which is otherwise conventionally disposed between the light emitting element 11 and the light-transmissive member 12. Thus, light absorption or light reflection due to another member disposed between the light emitting element 11 and the light-transmissive member 12 can be avoided, so that the light extraction efficiency can be improved. On the other hand, light emitted from the light emitting element 11 is incident on a region other than the projecting portion of the lower surface of the light-transmissive member 12 (that is, a region on an outer side of the light emitting element 11 in a plan view) mainly via the light guiding member 13. Accordingly, reducing the thickness of the light-transmissive member 12 at this region allows for reducing the difference in luminance between the central part and the outer peripheral part of the upper surface of the light-transmissive member 12. In particular, in the case where the light-transmissive member 12 contains a fluorescent material which will be described below, this structure effectively allows for reducing color unevenness at the outer peripheral part.

Light Emitting Element 11

The light emitting element 11 is preferably a light emitting diode including a semiconductor layer that includes an n-type semiconductor layer, a p-type semiconductor layer, and a light emitting layer. The wavelength of the light emitting element 11 may be appropriately selected according to the purpose and intended use thereof. In the light emitting element 11, one surface side of the semiconductor layer is the main light extraction surface. Examples of the light emitting element 11 configured to emit blue light (i.e., light having a wavelength in a range of 430 nm to 490 nm) or green light (i.e., light having a wavelength in a range of 490 nm to 570 nm) include a light emitting element in which a semiconductor layer such as ZnSe, a nitride-based semiconductor ($In_XAl_YGa_{1-X-Y}N$, $0≤X$, $0≤Y$, $X+Y≤1$), or GaP is used. Further, examples of the light emitting element 11 configured to emitted light (i.e., light having a wavelength in a range of 620 nm to 750 nm) include a light emitting element in which semiconductor layer such as GaAlAs or AlInGaP is used. As will be described below, in the case where the light emitting device 10 contains a fluorescent material, the light emitting device 10 preferably includes a nitride semiconductor ($In_XAl_YGa_{1-X-Y}N$, $0≤X$, $0≤Y$, $X+Y≤1$) for emitting light of a short wavelength, which can efficiently excite the fluorescent material. The component composition, color of emitted light, size or the like of the light emitting element 11 may be selected as appropriate according to the purpose and intended use of the light emitting element 11.

The light emitting element 11 includes a plurality of electrodes connected to the semiconductor layer. While the plurality of electrodes may be disposed respectively on different surfaces of the semiconductor layer, preferably they are disposed on the same surface of the semiconductor layer. This allows the light emitting element 11 to be flip-chip mounted on the substrate 15. In the case where the light emitting element 11 is flip-chip mounted on the substrate 15 such that the surface where the plurality of electrodes is formed faces downward to be the lower surface, the upper surface opposite to the lower surface serves as the main light extraction surface of the light emitting element 11.

Any of various shapes such as a circle, an oval, or a polygon such as a square or a hexagon may be employed as a planar shape of the light emitting element 11. The planar shape of the light emitting element 11 is preferably a quadrangle such as a square, a rectangle or the like, or a regular hexagon. The size of the light emitting element 11 may be selected as appropriate in accordance with the intended use, the desired performance and the like.

As will be described below, at the light extraction surface of the light emitting element 11, the light-transmissive member 12 is disposed so as to be in contact therewith. As will be described below, the light-transmissive member 12 is preferably directly bonded and fixed without using an adhesive agent or the like. Accordingly, the light extraction surface of the light emitting element 11 is preferably smooth. For example, the surface roughness Ra of the light extraction surface is preferably 1.0 nm or smaller, and further preferably 0.3 nm or smaller. The surface roughness Ra as used herein refers to the value represented as the "arithmetic average roughness Ra" in JIS B0601:2013.

Light-Transmissive Member 12

The light-transmissive member 12 is disposed so as to be in contact with the light extraction surface of the light emitting element 11.

The light-transmissive member 12 includes a projecting portion at its lower surface facing the light emitting element. In other words, the light-transmissive member 12 includes a first lower surface 12B1, an upper surface 12A, first lateral surfaces 12S1, second lateral surfaces 12S2, and a second lower surface 12B2. More specifically, the light-transmissive member 12 includes the first lower surface 12B1 in contact with the light extraction surface of the light emitting element 11, the upper surface 12A opposite to the first lower surface 12B1, the first lateral surfaces 12S1 connected to the upper surface 12A, the second lateral surfaces 12S2 on an inner side of the first lateral surfaces, and the second lower surface 12B2 between the first lateral surfaces 12S1 and the second lateral surfaces 12S2. The height from the first lower surface 12B1 to the upper surface 12A of the light-transmissive member 12 is greater than the height from the second lower surface 12B2 to the upper surface 12A.

The upper surface 12A and the first lower surface 12B1 of the light-transmissive member 12 are surfaces opposite to each other, and are preferably opposite to each other so as to be in parallel.

The first lower surface 12B1 of the light-transmissive member 12 is in contact with the light extraction surface of the light emitting element 11 and preferably, as will be described below, is directly bonded and fixed to the light extraction surface of the light emitting element 11 without using an adhesive agent or the like. This structure allows for preventing light absorption or light reflection, which would otherwise occur, by an adhesive agent or the like that are conventionally used. Accordingly, light emitted from the light emitting element can be incident on the light-transmissive member 12 without being influenced by an adhesive agent or the like. This allows for improving the light extraction efficiency of the light emitting device 10 in which the upper surface of the light-transmissive member 12 is the light emitting surface.

The first lower surface 12B1 is directly bonded to the light extraction surface of the light emitting element 11 using various kinds of bonding methods, which will be described below. Accordingly, the first lower surface 12B1 is preferably smooth, for example, having are Ra of 1.0 nm or smaller, more preferably 0.3 nm or smaller.

The first lower surface 12B1 may have a see similar to a size, of the light extraction surface of the light emitting element 11 (that is, the upper surface of the light emitting element 11), but a size of the first lower surface 12B1 is preferably slightly greater than the light extraction surface of the light emitting element 11 so as to enclose the light extraction surface of the light emitting element 11. For example, the first lower surface 12B1 preferably has an area 100% to 120% of an area of the light extraction surface of the light emitting element 11. Preferably, a portion or art entirety of the outer edge of the first lower surface 12B1 is located on an outer side of the outer edge of the light extraction surface of the light emitting element 11. More preferably, an entirety of the outer edge of the first lower surface 12B1 is disposed on an outer side of the outer edge of the light extraction surface of the light emitting element 11. Further, the first lower surface 12B1 is preferably disposed so that its center substantially coincides with the center of the light extraction surface of the light emitting element 11. Further, similarly to the light emitting element 11, while the first lower surface 12B1 may have any of various planar shapes, the first lower surface 12B1 preferably has a shape of a quadrangle such as a square or a rectangle, or a regular hexagon. More preferably, the first lower surface 12B1 has the same or similar shape as a shape of the light extraction surface of the light emitting element 11.

For example, a distance W2 between the outer edge of the first lower surface 12B1 and the outer edge of the light extraction surface of the light emitting element 11 may be in a range of 10 µm to 50 µm, preferably 10 µm to 40 µm, more preferably 15 µm to 30 µm. In this manner, with the first lower surface 12B1 of the light-transmissive member 12 having a portion exposed from the light extraction surface of the light emitting element 11, a path of light propagating obliquely from the light extraction surface of the light emitting element toward the outer edge of the upper surface 12A of the light-transmissive member 12 can be obtained. That is, in a cross-sectional view, it is preferable that the distance W2 allows for obtaining a path of a straight line connecting an end portion of the upper surface of the light-transmissive member 12 and an end portion of the light extraction surface of the light emitting element 11.

The upper surface 12A of the light-transmissive member is a surface that constitutes, as the light emitting surface of the light emitting device 10, a portion of an outer surface (for example, the upper surface) of the light emitting device 10. The upper surface 12A is opposite from the first lower surface 12B1, and has an area greater than that of the first lower surface 12B1. For example, an area of the upper surface 12A is greater than the area of the first lower surface 12B1, and preferably has an area of up to about 150% of the area of the first lower surface 12B1. The upper surface 12A is preferably disposed such that its center coincides with the center of the first lower surface 12B1. Further, the upper surface 12A has a size greater than a size of the light extraction surface of the light emitting element 11, and preferably has an area of up to about 170% of the area of the light extraction surface of the light emitting element 11. The upper surface 12A is preferably disposed such that its center substantially coincides with the center of the light extraction surface of the light emitting element 11.

Similarly to the light emitting element 11, the upper surface 12A may have any of various planar shapes, but preferably the planar shape thereof is a quadrangle such as a square or a rectangle, or a regular hexagon. In view of light emission distribution, the planar shape of the upper surface 12A is more preferably similar to the shape of the light extraction surface of the light emitting element 11.

The upper surface 12A may include small irregularities. Such irregularities allow for facilitating scattering of light emitted from the upper surface 12A, so that the extraction efficiency of light from the upper surface 12A can be improved.

The first lateral surfaces 12S1 of the light-transmissive member 12 are lateral surfaces of the light-transmissive member 12 connected to the upper surface 12A. While the first lateral surfaces 12S1 are preferably substantially perpendicular to the upper surface 12A, the first lateral surfaces 12S1 may be slightly narrowed, widened, or narrowed and widened toward the lower surface side. For example, the angle between the first lateral surface 12S1 and the upper surface 12A may be in a range of approximately 90±10 degrees. Further, the connecting portions between the first lateral surfaces 12S1 and the upper surface 12A may be rounded. Each of the first lateral surfaces 12S1 may be a curved surface or a surface including a curved surface.

Each of the first lateral surfaces 12S1 may be smooth or may have small irregularities.

The height of each of the first lateral surfaces 12S1, in other words, a height T1 from the upper surface 12A to the second lower surface 12B2, which will be described below, can be in a range of $2/10$ to $8/10$, preferably $3/10$ to $7/10$, more preferably $3/10$ to $6/10$, and further preferably $3/10$ to $5/10$ of the overall height T of the light-transmissive member 12. More specifically, the height of the first lateral surface 12S1 may be in a range of 30 µm to 200 µm, preferably 40 µm to 180 µm, and more preferably 50 µm to 165 µm. Such a height allows for obtaining the mechanical strength of the light-transmissive member 12 during manufacturing. Further, in the light emitting device 10 having first lateral surfaces 12S1 that are covered with the covering member 14 which will be described below, the difference in luminance between the light emitting portion and the non-light emitting portion can be more conspicuous.

The second lateral surfaces 12S2 are lateral surfaces of the light-transmissive member 12 positioned on an inner side of the first lateral surfaces 12S1 of the light-transmissive member 12 and connected to the first lower surface 12B1.

The second lateral surfaces 12S2 are preferably substantially perpendicular to the first lower surface 12B1, but the second lateral surfaces 12S2 may be slightly narrowed or widened toward the upper surface side. For example, the allowable degree thereof may be about 90±10. Further, the coupling portion between them may be rounded. The second lateral surface 12S2 may be a curved surface or a surface including a curved surface.

A height of each of the second lateral surfaces 12S2, in other words, a height T2 from the first lower surface 12B1 to the second lower surface 12B2, which will be described below, can be in a range of 2/10 to 8/10, preferably 3/10 to 7/10, more preferably 3/10 to 6/10, and further preferably 3/10 to 5/10 of the total height T of the light-transmissive member 12. More specifically, the height can be in a range of 30 μm to 200 μm preferably 40 μm to 180 μm, and more preferably 50 μm to 165 μm. Such a height reliably allows for obtaining mechanical strength of the light-transmissive member 12 during manufacturing.

Each of the second lateral surfaces 12S2 may be smooth or may have small irregularities.

Depending on the manner of processing the second lateral surfaces 12S2, the boundary between the second lateral surface 12S2 and the second lower surface 12B2, which will be described below, may not clearly exist, and the second lateral surface 12S2 and the second lower surface 12B2 may be continuous with each other. For example, the second lateral surface 12S2 and the second lower surface 12B2 may be continuous to each other to be a curved surface. The curved surface in this case can be inwardly depressed and outwardly projected. Such a curved surface is regarded as the second lateral surface 12S2 so long as the light-transmissive member 12 includes an outer peripheral portion having a thickness smaller than a thickness of the central portion of the light-transmissive member 12.

The second lower surface 12B2 is connected to both the first lateral surfaces 12S1 and the second lateral surfaces 12S2, and disposed at a part of or the entirety of the outer periphery of the first lower surface 12B1.

A width W1 of the second lower surface 12B2 is, for example, about 2.5% to 7.5% of a length of one side of the light emitting element 11. In view of another aspect, for example, the width W1 may be in a range of 10 μm to 200 μm, preferably 20 μm to 100 μm, and more preferably 50 μm to 75 μm. Thus, in combination with the shape of the light guiding member 13 which will be described below, unevenness in light emission at the outer periphery of the light-transmissive member 12 can be reduced. The "width W1" refers to the distance between each of the first lateral surfaces 12S1 and a respective one of the second lateral surfaces 12S2, more specifically, the distance between the outermost portion of each of the first lateral surfaces 12S1 to the outermost portion of a respective one of the second lateral surface 12S2. Note that, the width W1 of the second lower surface 12B2 is preferably constant along the outer periphery of the first lower surface 12B1, but the width W1 may be partially increased or reduced.

For the light-transmissive member 12, for example, an inorganic material such as a resin molded body, ceramic, glass, or the like can be used. As used herein, the term "light transmissive" refers to that a base material of the light-transmissive member 12 transmits 60% or more, preferably 70% or more, and more preferably 80% or more of light emitted from the light emitting element.

The light-transmissive member 12 preferably contains a fluorescent material. Examples of the light-transmissive member 12 containing a fluorescent material includes a sintered body of a fluorescent material, resin, glass, ceramic, or other inorganic material containing a fluorescent material. For the fluorescent material, fluorescent materials known in the art, such as a yttrium-aluminum-garnet-based fluorescent material (a YAG-based fluorescent material), a nitride-based fluorescent material, an oxynitride fluorescent material, a $K_2SiF_6$:Mn-based fluorescent material (a KSF fluorescent material), and a sulfide-based fluorescent material can be appropriately used. These fluorescent materials are used in desired combination and/or with a desired blending ratio suitable for a desired color to adjust color rendering and color reproductivity. With the light-transmissive member 12 containing a fluorescent material, light emitted toward outside from the upper surface of the light-transmissive member 12 is a mixed-color light which is the mixture of light emitted from the light emitting element 11 and light having a wavelength converted by the fluorescent material. Accordingly, for example, allowing blue emitted from the light emitting element 11 and yellow-color light obtained by converting a wavelength of a portion of the blue light by a fluorescent material to mix with each other allows for obtaining the light emitting device 10 configured to emit white light.

A YAG-based fluorescent material is a representative fluorescent material with which emission of white mixed-color light can be obtained in a suitable combination with a blue-color light emitting element. Examples of the YAG-based fluorescent material include, for example, $(Re_{1-x}Sm_x)_3(Al_{1-y}Ga_y)_5O_{12}$:Ce ($0 \leq x < 1$, $0 \leq y \leq 1$, where Re is at least one element selected from the group consisting of Y, Gd, and La) or the like.

In the case where the light emitting device configured to emit white light using a YAG-based fluorescent material is to be obtained, the concentration of the fluorescent material contained in the light-transmissive member 12 can be selected as appropriate so as to realize emission of white light. For example, the concentration of the fluorescent material contained in the light-transmissive member 12 may be in a range of 5 wt % to 50 wt %.

Further, using a blue light emitting element for the light emitting, element 11 and using a YAG-based fluorescent material and a nitride-based fluorescent material containing a greater amount of a red-color component for a fluorescent material allows emission of light of amber color. The expression "amber color" refers to, in JIS standard Z8110, the region consisting of a long wavelength region in yellow color and a short wavelength region in yellow-red color, and the chromaticity range between the yellow region and the yellow-red short wavelength region in JIS standard Z9101, which is related to safety colors. For example, the "amber color" refers to the region of the dominant wavelength in a range of 580 nm to 600 nm as. Many of fluorescent materials adapted to emit amber color has low light conversion efficiency, so that a concentration of fluorescent material is preferably increased in order to obtain a desired color. Further, while heat generation of the fluorescent material adapted to emit amber-color light is greater than heat generation of other fluorescent materials, reducing the thickness of the light-transmissive member 12 and increasing the fluorescent material concentration allows the fluorescent material adapted to emit amber-color light to be suitably used.

The nitride-based fluorescent material is expressed as, for example, $CaAlSiN_3$:Eu, (Sr, Ca)$AlSiN_3$:Eu, (Sr, Ca)$_2Si_5N_8$:Eu, (Sr, Ca)$Si_7N_{10}$:Eu or the like.

For the light-transmissive member 12, a light emitting substance such as a so-called nanocrystal, quantum dots or the like may be used. Examples of such a material may be a semiconductor material include a Group II-VI, Group III-V, or Group IV-VI semiconductor, specifically, nano-sized highly dispersed particles of CdSe, core-shell type $CdS_xSe_{1-x}$/ZnS, GaP, InAs or the like. Such a fluorescent material may have a particle size in a range of, for example, about 1 nm to 100 nm, preferably about 1 nm to 20 nm. Using such a light-transmissive member 12 allows for reducing the internal scattering and scattering of color-converted light, allows for further improving transmittance of light.

The light-transmissive member 12 may be formed as a single layer made of one type of a material or as a single layer made of two or more types of materials being mixed with each other. Alternatively, in the light-transmissive member 12, two or more single layers may be layered.

Further, as necessary, the light-transmissive member 12 may contain a light diffusing material. Increase in concentration of fluorescent material in the light-transmissive member 12 tends to cause unevenness in emission color. However, with the light-transmissive member 12 containing a light diffusing material, unevenness in emission color and in luminance can be reduced. Examples of the light diffusing material include titanium oxide, barium titanate, aluminum oxide, silicon oxide and the like.

The light-transmissive member 12 has a thickness T that allows for preventing a reduction in mechanical strength during manufacturing and providing sufficient mechanical strength to the light-transmissive member 12. For example, the thickness T may be 50 μm or more. Further, in view of ease of processing, the thickness T may be, for example, 300 μm or smaller. In view of these, the thickness T of the light-transmissive member 12 may be in a range of, for example, 50 μm to 300 μm, preferably 70 μm to 300 μm, and more preferably 100 μm to 200 μm.

Light Guiding Member 13

The light guiding member 13 covers at least a portion of each of the lateral surfaces of the light emitting element 11. Further, the light guiding member 13 covers at least a portion of each of the second lateral surfaces and the second lower surface of the light-transmissive member 12. In other words, the light guiding member 13 covers the lateral surfaces of the light emitting element 11 and the lateral surfaces of the projecting portion of the light-transmissive member 12. In the case where the first lower surface 12B1 of the light-transmissive member 12 is larger than the light extraction surface of the light emitting element 11, the first lower surface 12B1 not in contact with the light extraction surface of the light emitting element 11 is also covered with the light guiding member 13. It is preferable that the first lateral surfaces 12S1 of the light-transmissive member 12 are not covered with the light guiding member 13. With the light guiding member 13 not covering the first lateral surfaces 12S1 of the light-transmissive member 12, that is, with the light guiding member 13 spaced apart from the light emitting surface of the light emitting device 10, leakage of light from the light guiding member 13 to the outside can be reduced. Thus, the light emitting surface of the light emitting device 10 can be limited to be the upper surface 12A of the light-transmissive member 12.

As shown in FIG. 1C, the light guiding member 13 is disposed so as to extend from a lateral surface of the light emitting element 11 to the second lower surface 12B2 of the light-transmissive member 12. A thickness of the light guiding member 13 covering a lateral surface of the light emitting element 11 (that is, a width of the light guiding member 13 in a planar direction as measured between the lateral surface of the light emitting element 11 and the lateral surface of the light guiding member 13) increases toward the light-transmissive member 12 (that is, toward the upper surface of the light emitting device 10). Further, it is preferable that the thickness of the light guiding member 13 reduces toward the lower surface of the light emitting element 11 so that light guiding member 13 has a substantially triangular shape in a cross-sectional view. The lateral surfaces 13a of the light guiding member 13 opposite to the surfaces of the light guiding member 13 facing the lateral surfaces of the light emitting element 11 may be a flat surface surrounding the outer periphery of the light emitting element 11, or may be curved surfaces each of which is inwardly recessed and outwardly projected. Further, it is preferable that a portion of the light guiding member 13 covering the second lateral surfaces 12S2 of the light-transmissive member 12 has substantially the same thickness entirely along the height direction of the second lateral surface 12S2.

With the light guiding member 13 having lateral surfaces each having such a shape, light emitted from the light emitting element 11 spreads over the planar area similar to the area of the upper surface 12A of the light-transmissive member 12, and thereafter is incident on the second lower surface 12B2 of the light-transmissive member 12. Thus, light emitted from the light emitting element 11 easily reaches an end portion of the second lower surface 12B2 of the light-transmissive member 12 and, consequently, light emission unevenness at the upper surface 12A at the light-transmissive member 12 can be reduced.

As to the light guiding member 13, the maximum thickness of the light guiding member 13 at a portion covering the lateral surfaces of the light emitting element 11 is preferably equal to or smaller than the total length of the width W1 of the second lower surface 12B2 and the distance W2 between the outer edge of the first lower surface 12B1 and the outer, edge of the light extraction surface of the light emitting element 11 (that is, the instance between each of the lateral surfaces of the light emitting element 11 and a respective one of the first lateral surfaces 12S1 of the light-transmissive member 12), and equal to or greater than the width W1 of the second lower surface 12B2 of the light-transmissive member 12.

The outer peripheral portion of the light guiding member 13 in contact with the second lower surface 12B2 may be located on an inner side of the outer edge of the second lower surface 12B2, but it is preferable that the outer peripheral portion of the light guiding member 13 substantially coincides with the outer edge of the second lower surface 12B2.

The lower end portion of the light guiding member 13 in contact with the lateral surfaces of the light emitting element 11 is preferably located at a position higher than a position of the lower end portion of the light emitting element 11, or coincides with the lower end portion of the light emitting element 11.

The light guiding member 13 preferably covers, for example, an entirety of the lateral surfaces at the light emitting element 11, an entirety of each of the second lateral surfaces and second lower surface of the light-transmissive member 12, and an entirety of a portion of first lower surface 12B1 not in contact with the light extraction surface of the light emitting element 11. With this arrangement, light emitted from a lateral surface of the light emitting element 11 is reflected at the interface between the light guiding member 13 and the covering member 14, which will be described below, and the light is incident on the light-transmissive member 12. Further, light emitted from the second lateral surface 12S2 of the light-transmissive member 12 is reflected at the interface between the light guiding member 13 and the covering member 14, which will be described below, and the light is incident on the light-transmissive member 12. This allows for improving light extraction efficiency of light from the upper surface of the light-transmissive member 12.

The light guiding member 13 is preferably made of a light-transmissive material that can guide light emitted from the light emitting element 11 to the light-transmissive member 12. Examples of such a material include an organic resin such as epoxy resin, silicone resin, phenolic resin, and polyimide resin. Among these, silicone resin is preferable. The material of light guiding member 13 may contain the above-described light diffusing member.

As described above, with the light guiding member 13 continuously covering the lateral surfaces of the fight emitting element 11 and the lower surface of the light-transmissive member 12, connection between the light emitting element 11 and the light-transmissive member 12 can be reinforced.

Covering Member 14

Figure 1D:
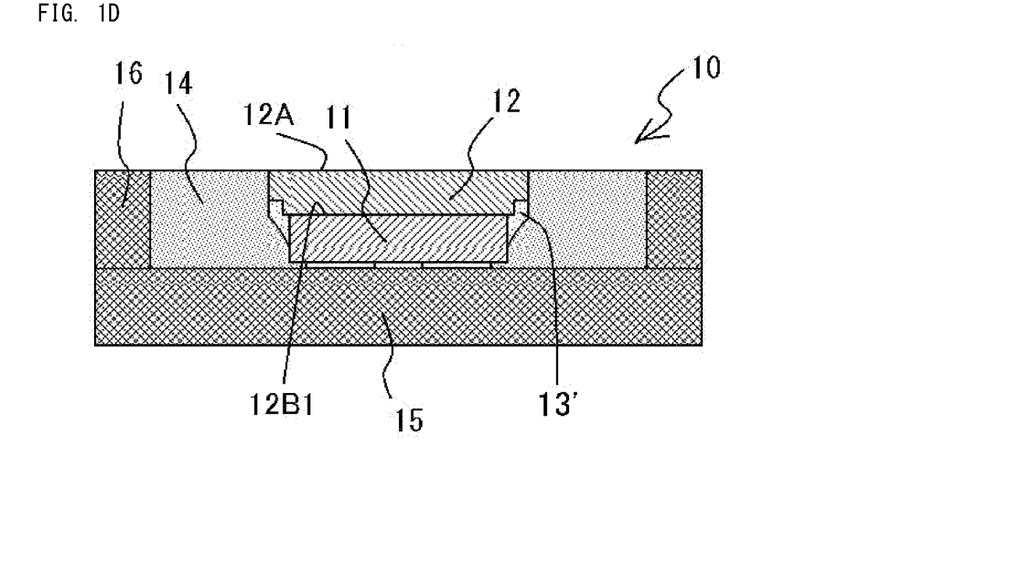
FIG. 1D is a cross-sectional view showing the structure of a light emitting device according to another embodiment of the present disclosure.

The covering member 14 covers the first lateral surfaces 12S1 of the light-transmissive member 12 and the lateral surfaces 13a of the light guiding member 13. In the light emitting element 11, in the case where a portion of each of the lateral, surfaces of the light emitting element 11 is exposed from the light guiding member 13, the covering member 14 covers the portion of the lateral surfaces of the light emitting element 11 exposed from the light guiding member 13' as shown in FIG. 1D. This allows substantially all the light emitted from the tight emitting element 11 to be incident on the light-transmissive member 12.

As will be described below, in the case where the light emitting element 11 and the like are mounted on the substrate 15, the covering member 14 is preferably disposed also between the lower surface of the light emitting element 11 and the substrate 15, and on the substrate 15, in addition to at the lateral surfaces of each of the light-transmissive member 12, the light guiding member 13, and the light emitting element 11.

For the covering member 14, an insulating material is preferably used, and for example, a resin material is used. Examples of the resin materials include a resin containing at least one type of silicone resin, modified silicone resin, epoxy resin, modified epoxy resin, acrylic resin, phenolic resin, BT resin, and PPA, or hybrid resin. Among these, silicone resin, which has good heat resistance, electrical insulating property, and flexibility, is preferable. Further, the covering member 14 is preferably light reflective. The covering member 14 being light reflective can be obtained by causing the base material made of the above-described insulating material to contain a light reflecting substance. Examples of the light reflecting substance include titanium oxide, silicon oxide, zirconium oxide, magnesium oxide, calcium carbonate, calcium hydroxide, calcium silicate, zinc oxide, barium titanate, potassium titanate, alumina, aluminum nitride, boron nitride, mullite and the like. Among these, titanium oxide is relatively stable to moisture or the like and has a high refractive index, and thus is preferable. Further, for the covering member 14, a ceramic may be used as an insulating material exhibiting good light reflectivity and heat dissipation property. Examples of such a ceramic include aluminum oxide, aluminum nitride, and boron nitride.

Substrate 15

The light emitting element 11 may be optionally mounted on the substrate 15. The substrate 15 can collectively support the light emitting element 11, the covering member 14, and the like. Further, the substrate 15 electrically connects the light emitting device 10 to an external component. Accordingly, on a surface of the substrate 15, a wiring pattern is formed for establishing electrical connection between an external power source and the light emitting element. The light emitting element and the like are preferably mounted on the wiring pattern.

In the case where a bonding member is used for mounting of the light emitting element 11 on the substrate 15, a bump made of Au or alloy thereof, eutectic solder (Au—Sn), Pb—Sn, lead-free solder, or the like may be used for the bonding member.

For the substrate 15, an insulating material that does not easily transmit light front the light emitting element 11 and external light is preferably used. Examples at a material of the substrate 15 include a ceramic such as alumina, aluminum nitride, mullite or the like, or a resin material such as phenolic resin, epoxy resin, polyimide resin, BT resin, polyphthalamide or the like. Alternatively, a composite material of an insulating material and a metal member may be employed. In the case of employing a resin as a material of the substrate 15, as necessary, an inorganic filler such as glass fibers, silicon oxide, titanium oxide, alumina or the like may be mixed with the resin. This allows improvement in the mechanical strength, reduction in the thermal expansion coefficient, and improvement in the light reflectivity. The substrate 15 may have any appropriate thickness according to its purpose and intended use.

On the substrate 15, in addition to the light emitting element 11 and the like, a flame body 16 for holding the covering member 14 may be disposed.

Electronic Component

The light emitting device 10 according to the present embodiment may include, as well as the light emitting element 11, another electronic component adjacent to the light emitting element 11. For the electronic component, a component not intended to serve to emit light from the light emitting device 10 may be used, such as a transistor for controlling the light emitting element, or a protective element such as a Zener diode to which electricity is supplied when a voltage of a predetermined voltage or more is applied. The protective element is electrically connected to be anti-parallel to the p-electrode and the n-electrode of the light emitting element 11. With this structure, the voltage between the p-electrode and the n-electrode of the light emitting element 11 can be prevented from being equal to or greater than the Zener voltage, which allows for properly preventing element breakdown or decrease in performance of the light emitting element 11 due to application of an excessively great voltage.

These electronic components are preferably embedded in the covering member 14.

In the light emitting device 10 having such a structure, the light-transmissive member 12 disposed on the light extraction surface of the light emitting element 11 and the light guiding member 13 efficiently allow substantially all the light emitted from the light emitting element 11 to be incident on the light-transmissive member 12.

In particular, in the case where the light-transmissive member 12 contains a fluorescent material, reducing the thickness of the outer peripheral portion of the light-transmissive member 12 that does not overlap the light emitting element 11 allows for reducing the amount of the component of a specific color of light emitted from an end portion of the light emitting surface (that is, the upper surface of the light-transmissive member 12), for example, the yellow-color component when YAG is employed. This structure allows for improving the front luminance, and effectively reducing occurrence of ring-like unevenness in emission color at the outer peripheral part of the light emitting surface.

Method of Manufacturing Light Emitting Device

Figure 2A:
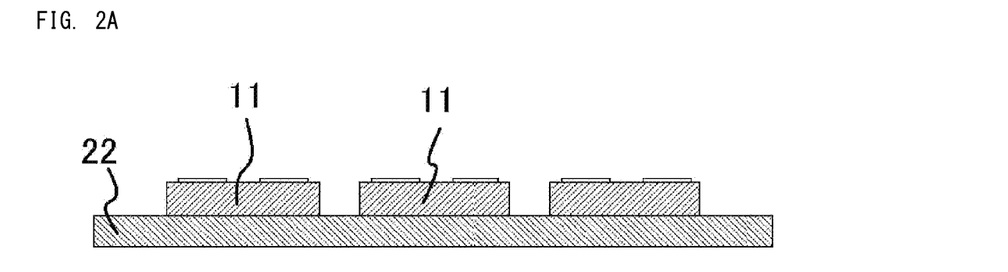
FIG. 2A is a schematic cross-sectional view schematically showing a method of manufacturing the light emitting device shown in FIG. 1A.
Figure 2B:
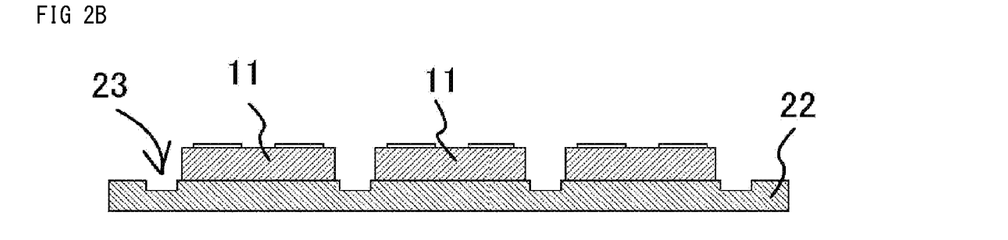
FIG. 2B is a schematic cross-sectional view schematically showing the method of manufacturing the light emitting device shown in FIG. 1A.
Figure 2C:
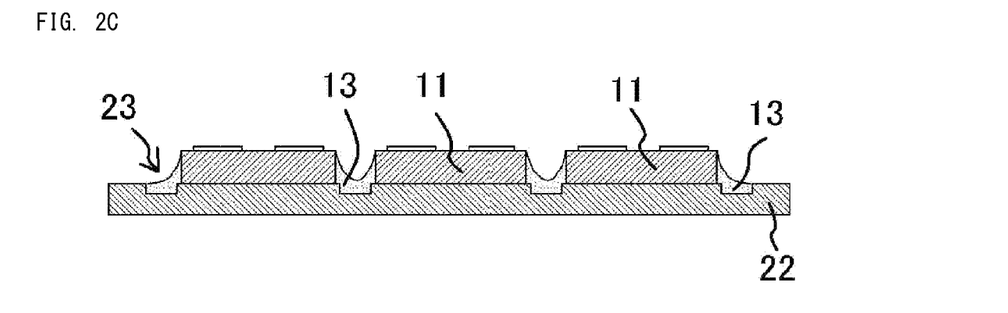
FIG. 2C is a schematic cross-sectional view schematically showing the method of manufacturing the light emitting device shown in FIG. 1A.
Figure 2D:
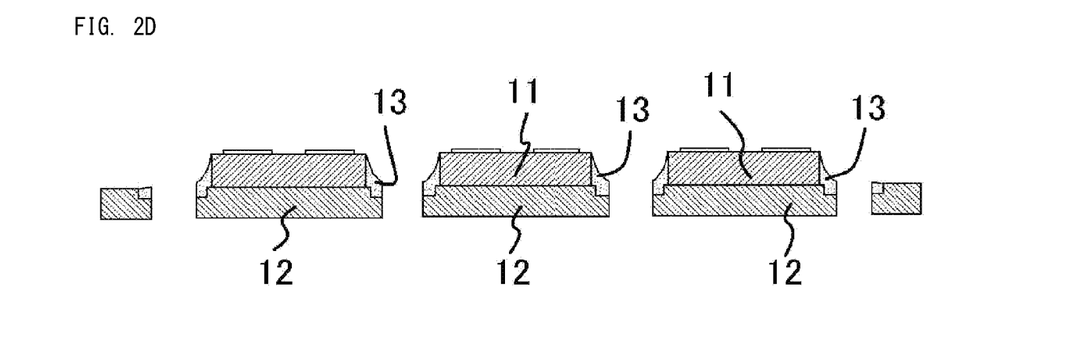
FIG. 2D is a schematic cross-sectional view schematically showing the method of manufacturing the light emitting device shown in FIG. 1A.

A method of manufacturing a light emitting device according to the present embodiment includes:

bonding a plurality of light emitting elements 11 onto a light-transmissive substrate 22 (FIG. 2A);

forming one or more grooves 23 on the light-transmissive substrate 22 so as to surround an outer periphery of each of the plurality of light emitting elements 11 (FIG. 2B);

disposing at least one light guiding member 13 continuously covering inner side of the one or more grooves 23 and an outer peripheral lateral surface of each of the plurality of light emitting elements 11 (FIG. 2C); and dividing the light-transmissive substrate 22 at a position between the plurality of light emitting elements 11, to obtain a light emitting device in which at least one of the light emitting elements 11 is bonded to a single light-transmissive member 12 (FIG. 2D).

A: Bonding Light Emitting Element 11

As shown in FIG. 2A, a plurality of light emitting elements 11 are bonded onto the light-transmissive substrate 22.

The plurality of light emitting elements 11 may be bonded onto the light-transmissive substrate 22 by using a method known in the art. Among these, a room-temperature bonding is preferably used. The room-temperature bonding is a bonding technique in which the light-transmissive substrate 22 and the light emitting elements 11 are bonded to each other, for example, under the temperature condition of a room temperature of 10° C. to 40° C., preferably 15° C. to 25° C. Examples of the room-temperature bonding include a surface activated bonding, in which the bonding surfaces are subjected to surface treatment in a vacuum to be activated, and the two bonding surfaces are bonded to each other without application of an adhesive agent, heat, pressure or the like. Examples of the room-temperature bonding further include an atomic diffusion bonding, in which a micro crystal film is formed at each of the bonding surfaces in an ultra-high vacuum, and the thin films are overlaid on each other in a vacuum so that the bonding surfaces are bonded to each other. Alternatively, a hydroxyl group bonding may be employed, in which a hydroxyl group containing film is formed at each of the bonding surfaces by the atomic layer deposition, and the bonding surfaces are bonded to each other. As examples of these methods, methods described in WO 2011/126000, JP 2015-29079 A, JP 2014-232866 A or the like may be used.

In the room-temperature bonding, each bonding surface is subjected to surface treatment in the air or in a vacuum. For example, in a vacuum, any oxide film, dirt or the like attached to the bonding surface is removed by irradiation of ions or plasma of argon or the like. The energy, time and the like in this case can be adjusted as appropriate. Such a treatment allows atoms having bonds to be exposed at the bonding surface, and exhibiting a very active state where high bonding property with other atoms is exhibited. Thus, by bringing the bonding surfaces into contact with each other, the bonding force instantaneously acts, so that the bonding surfaces are firmly bonded to each other. Further, because the bonding is carried out at the atomic level, the bonding exhibits higher strength and durability as compared with bonding through an adhesive agent or the like. Because such bonding does not cause thermal distortion or thermal stress attributed to heating, stable bonding can be realized.

In order to effectively carry out the room-temperature bonding, respective bonding surfaces between the light-transmissive substrate 22 and the light emitting element 11 to be bonded to each other are preferably highly smooth. More specifically, the arithmetic average roughness Ra of the bonding surfaces is preferably 1.0 nm or smaller, more preferably 0.3 nm or smaller. For a method of obtaining such a surface roughness of the bonding surfaces, any of known methods including the mechanical polishing, the chemical polishing, the chemical mechanical polishing or the like may be employed.

Figure 3:
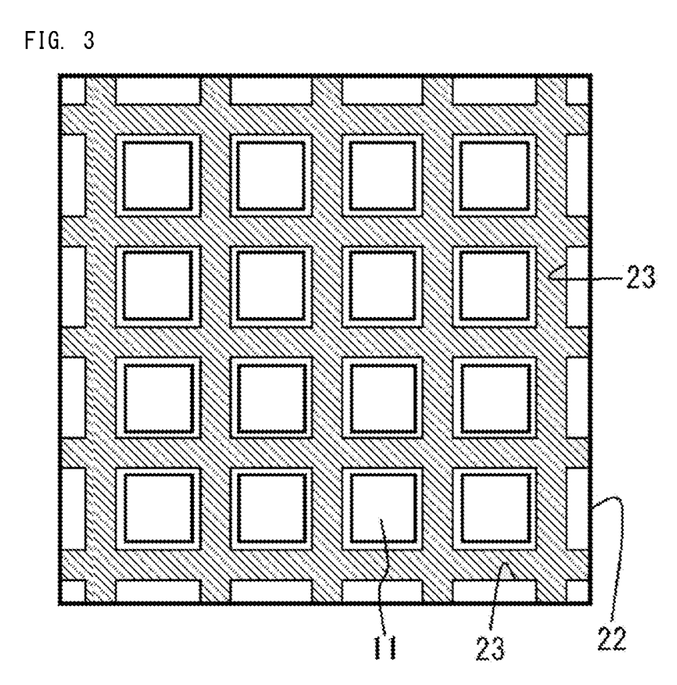
FIG. 3 is a schematic plan view corresponding to the schematic cross-sectional view in FIG. 2B.

As shown in FIG. 3, the plurality of light emitting elements 11 are preferably disposed on the light-transmissive substrate 22 in a regular manner (for example, in a matrix). More preferably, the light emitting elements 11 are arranged at regular intervals. The distance between adjacent ones of the light emitting elements 11 is selected in view of the dimension of each part of the light-transmissive member 12 to be obtained, and may be in a range of, for example, 100 μm to 500 μm.

The light-transmissive substrate 22 is a flat plate-shaped substrate made of the above-described material of the light-transmissive member 12. While the bonding surfaces are very smooth as described above, surfaces other than the bonding surfaces may not be smooth and may have irregularities.

B: Forming Groove 23

As shown, in FIGS. 2B and 3, in the light-transmissive substrate 22, the groove 23 surrounding the outer periphery of each of the plurality of light emitting elements 11 is formed.

The groove 23 is for demarcating the light-transmissive member 12 corresponding to the light emitting elements 11. In the case where the plurality of light emitting elements 11 are arranged in a matrix on the light-transmissive substrate 22, for example, the groove 23 may be formed to be a lattice shape as seen in a plan view. The groove 23 is formed with a blade having a predetermined width. The blade can have an appropriate width in view of a shape of the groove 23 to be obtained or the like. For example, the width of the groove 23 may be in a range of 20 μm to 200 μm, preferably 50 μm to 180 μm, and more preferably 100 μm to 150 μm. The groove 23 is preferably formed over a region between adjacent ones of the light emitting elements 11. In particular, it is preferable to form the groove along the outer peripheries of the light emitting elements 11 to have a width that allows the groove to reach a position near a corresponding one of the lateral surfaces of the light emitting elements 11. At this time, as shown in FIG. 3, by forming the groove 23 so as to be spaced apart from the light emitting elements 11, the blade for forming the groove and the light emitting elements are not brought into contact with each other even if, for example, accuracy in positions are varied during the plurality of light emitting elements on the light-transmissive substrate 22 are arranged in a matrix. Accordingly, occurrence of a damage to the light emitting dements can be reduced. Further, with the groove 23 and each light emitting element 11 to be spaced apart from each other, the light-transmissive member 12 can have the first lower surface having the dimension that allows the upper surface of the light emitting element to be located on an inner side of the periphery of the first lower surface of the light-transmissive member 12.

The depth of the groove corresponds to the height T2 (see FIG. 1C) of the second lateral surface 12S2, and is preferably approximately 3/10 to 7/10 of the total thickness T of the light-transmissive member 12.

Instead of using a blade, the groove may be formed at the surface of the light-transmissive substrate using laser light, or using photolithography and etching technique.

C: Disposing Light Guiding Member 13

As shown in FIG. 2C, the light guiding member 13 is disposed in the groove 23 to continuously cover the groove 23 and the outer peripheral lateral surfaces of the plurality of light emitting elements 11.

The light guiding member 13 can be made of the above-described material and formed by, for example, using a potting technique or printing. The light guiding member 13 is preferably formed such that a surface of the light guiding member 13 is recessed between the light emitting elements 11. When the light guiding member 13 is formed by using a potting technique, such a surface shape can be controlled as appropriate by adjusting the amount and/or viscosity of the material. For example, by dropping a resin material being the material of the light member 13 into the groove 23, the resin material creeps up the lateral surfaces of each light emitting element 11 due to surface tension, so that a portion or an entirety of the lateral surfaces of each of the light emitting elements can be covered with the light guiding member 13.

D: Singlating Light-Transmissive Substrate 22

As shown in FIG. 21, the light-transmissive substrate 22 is singulated at positions between the plurality of light emitting elements 11. Thus, the light emitting device in which one light emitting element 11 is bonded to one light-transmissive member 12 can be obtained.

The singulating of the light-transmissive substrate 22 can be performed by dividing the light-transmissive substrate 22 and the light guiding member 13 at positions between the light emitting elements 11. The dividing can be carried out by, for example, cleaving the light-transmissive substrate 22 along the center of the groove 23 using a blade having a predetermined width. The blade used for the dividing has a width smaller than a width of the blade used in the forming of the groove 23. The width of the blade used for the dividing inn be in a range of, for example, 30 µm to 100 µm. With such a width, as shown in FIGS. 1A to 1C, the first lower surface 12B1 of the light-transmissive member 12 can be formed to be smaller than the upper surface 12A by 50 µm to 75 µm.

The dividing may be carried out through use of laser light instead of the blade.

Thereafter, the obtained light emitting device (that is, the light emitting element 11 including the light-transmissive member 12 and the light guiding member 13) may be mounted on the wiring pattern on the substrate 15 as shown in FIGS. 1A and 1B. The mounting of the light emitting element 11 is preferably carried out in a flip-chip manner.

Further, the obtained light emitting device (that is, the light emitting element 11 including the light-transmissive member 12 and the light guiding member 13) may be optionally mounted on the substrate 15, and thereafter the covering member 14 is disposed to surround the light-transmissive member 12 and the light guiding member 13, and optionally on the substrate 15.

The covering member 14 may be formed by, for example, using a resin discharging device or the like that can shift in the top-bottom direction or the horizontal direction with respect to the substrate 15.

According to the method of manufacturing the light emitting device, in particular, forming the groove after mounting the light emitting element on the light-transmissive substrate allows for controlling the thickness of the light-transmissive member. That is, the light-transmissive member having the projecting portion, i.e., the first lower surface, the upper surface, the first lateral surfaces, the second lateral surfaces, and the second lower surface, can be manufactured highly precisely while reducing unevenness among a plurality of light emitting devices. Further, by adjusting the amount of the material of the light guiding member, the shape of the light guiding member is surely controlled, and the light guiding member having a proper shape can be disposed at proper position. Thus, a plurality of light emitting devices having good light extraction efficiency can be easily, precisely, and efficiently manufactured.

What is claimed is:

1. A light emitting device comprising:
    a light emitting element including a light extraction surface and a lateral surface;
    a light-transmissive member including
        a first lower surface in contact with the light extraction surface of the light emitting element, an outer periphery of the first lower surface being located on an outer side of the light extraction surface of the light emitting element in a plan view,
        an upper surface opposite to the first lower surface and having a greater area than an area of the first lower surface,
        a first lateral surface connected to the upper surface,
        a second lateral surface positioned on an inner side of the first lateral surface in the plan view and connected to the first lower surface, and
        a second lower surface connected to the first lateral surface and the second lateral surface;
    a light guiding member covering at least a portion of the lateral surface of the light emitting element, and at least a portion of the second lateral surface and at least a portion of the second lower surface of the light-transmissive member, a thickness of a portion of the light guiding member covering the portion of the lateral surface of the light emitting element increasing toward the light-transmissive member in a cross-sectional view, and a portion of the light guiding member covering the portion of the second lateral surface of the light-transmissive member having a constant thickness in the cross-sectional view; and a covering member covering the first lateral surface of the light-transmissive member and a lateral surface of the light guiding member.

2. The light emitting device according to claim 1, wherein the covering member covers a portion of the lateral surface of the light emitting element exposed from the light guiding member.

3. The light emitting device according to claim 1, wherein a thickness of the light-transmissive member is in a range of 50 μm to 300 μm.

4. The light emitting device according to claim 1, wherein a thickness of a portion of the light-transmissive member between the first lower surface and the second lower surface is 3/10 to 7/10 of an overall thickness of the light-transmissive member between the first lower surface and the upper surface.

5. The light emitting device according to claim 1, wherein the light-transmissive member contains a fluorescent material.

6. The light emitting device according to claim 1, further comprising
a substrate on which the light emitting element is mounted.

7. The light emitting device according to claim 1, wherein the light-transmissive member is a one-piece, unitary member.

8. The light emitting device according to claim 1, wherein the first lower surface and the second lower surface of the light-transmissive member are made of the same material.

9. The light emitting device according to claim 1, wherein
a size of the first lower surface of the light-transmissive member is greater than a size of the light extraction surface of the light emitting element in the plan view.

10. A light emitting device comprising:

a light emitting element including a light extraction surface and a lateral surface;

a light-transmissive member in contact with the light extraction surface of the light emitting element, the light-transmissive member including a projecting portion on a light emitting element side, the light-transmissive member having a first lateral surface and a second lateral surface with the projecting portion defining at least the second lateral surface;

a light guiding member covering the lateral surface of the light emitting element and the second lateral surface of the projecting portion of the light-transmissive member, a thickness of a portion of the light guiding member covering the lateral surface of the light emitting element increasing toward the light-transmissive member in a cross-sectional view, and a portion of the light guiding member covering the second lateral surface of the projecting portion of the light-transmissive member having a constant thickness in the cross-sectional view; and a covering member covering the first lateral surface of the light-transmissive member and a lateral surface of the light guiding member.

\* \* \* \* \*